United States Patent [19]
Schimpe

[11] Patent Number: 5,216,740
[45] Date of Patent: Jun. 1, 1993

[54] COMPONENT HAVING AN INTEGRATED WAVEGUIDE WITH DEFLECTED END FACES

[75] Inventor: Robert Schimpe, Ottobrunn/Riemerling, Fed. Rep. of Germany

[73] Assignee: Siemens Aktiengesellschaft, Munich, Fed. Rep. of Germany

[21] Appl. No.: 776,202

[22] Filed: Oct. 15, 1991

[30] Foreign Application Priority Data

Oct. 25, 1990 [DE] Fed. Rep. of Germany ....... 4034000

[51] Int. Cl.$^5$ .................................................. G02B 6/00
[52] U.S. Cl. .................................................... 385/129
[58] Field of Search ................................. 385/129–132

[56] References Cited

U.S. PATENT DOCUMENTS

| | | | |
|---|---|---|---|
| 3,873,183 | 3/1975 | Lee et al. ............................ | 385/129 |
| 4,141,621 | 2/1979 | Aagard et al. ................... | 385/129 X |
| 4,178,197 | 12/1979 | Marinace ......................... | 385/129 X |
| 4,711,514 | 12/1987 | Tangonan et al. ................... | 385/130 |
| 4,872,180 | 10/1989 | Rideout et al. ......................... | 372/99 |
| 4,919,507 | 4/1990 | Evans et al. ..................... | 385/130 X |

FOREIGN PATENT DOCUMENTS 4036000 5/1991 Fed. Rep. of Germany .

OTHER PUBLICATIONS

Abstract of Published Japanese Patent Application 58-141587 (Aug. 22, 1983), *Japanese Patent Abstracts*, vol. 7, No. 255(E-210) [1400], Nov. 12, 1983.

Wang et al., "Single-Layer Coating for Angled Facet Amplifier", *Electronics Letters*, Aug. 17, 1989, vol. 25, No. 17, pp. 1139–1141.

Olsson et al, "Ultra-low Reflectivity 1.5 µm Semiconductor Laser Preamplifier", *Electronics Letters*, vol. 24 No. 9, Apr. 28, 1988, pp. 569–570.

Barnsley et al, "Ultra-low Reflectivity Broadband 1.5 µm GaInAsP Semiconductor Optical Amplifiers", *Electronics Letters*, vol. 26, No. 12, Jun. 7, 1990, pp. 825–827.

Cha et al, "1.5 µm Band Travelling-Wave Semiconductor Optical Amplifiers with Window Facet Structure", *Electronics Letters*, vol. 25, No. 3, Feb. 2, 1989, pp. 242–243.

Dutta et al, "Fabrication and Performance Characteristics of Buried-Facet Optical Amplifiers", *J. Appl. Phys.* vol. 67, No. 9, May 1, 1990, pp. 3943–3947.

*Primary Examiner*—Akm E. Ullah
*Attorney, Agent, or Firm*—Hill, Steadman & Simpson

[57] ABSTRACT

A component having an integrated waveguide of a semiconductor material with buried end faces, whose surface normals extend at an angle relative to the longitudinal direction of the waveguide.

16 Claims, 2 Drawing Sheets

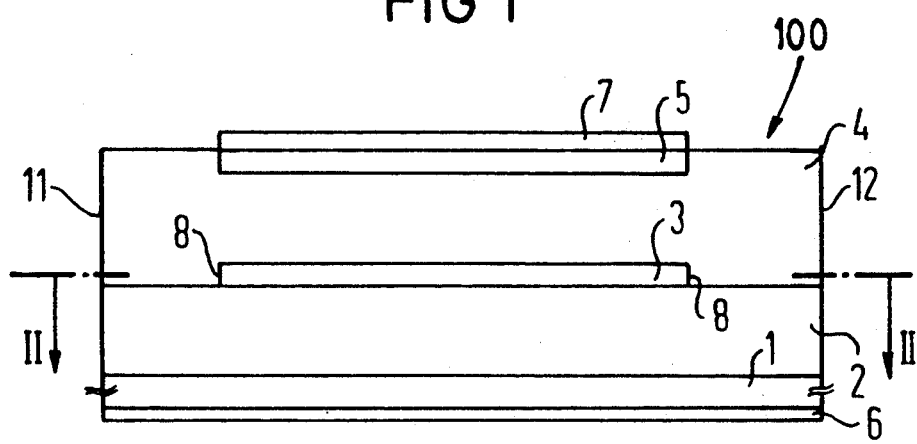
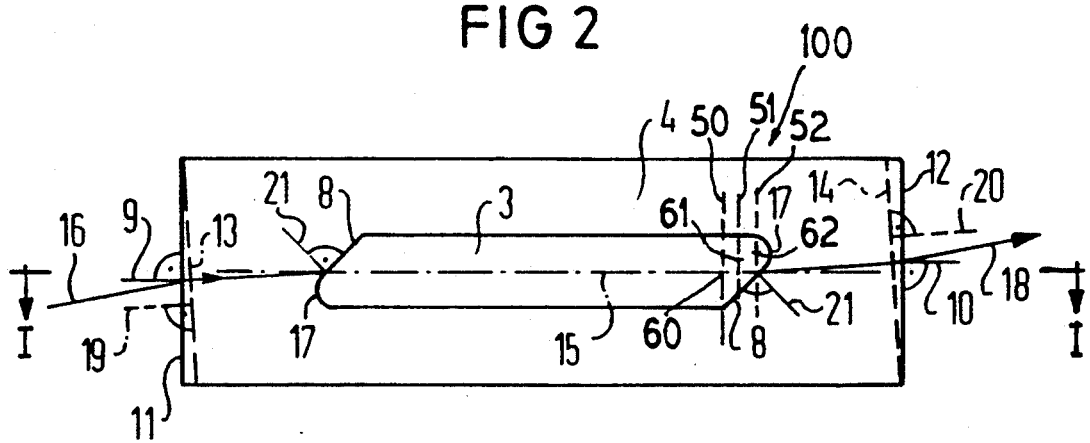

COMPONENT HAVING AN INTEGRATED WAVEGUIDE WITH DEFLECTED END FACES

BACKGROUND OF THE INVENTION

The present invention is directed to a component having end faces which are dereflecting or reflection-removing.

In order to achieve an optimum low reflection upon outfeed of radiation in opto-electronic components composed of waveguides, a demand has occurred for having dereflecting end faces for these waveguides. Residual reflections of less than 0.1% are often required, particularly for optical amplifiers.

The dereflecting end faces of waveguides can occur in various ways.

An article by Olsson et al entitled "Ultra-low Reflectivity 1.5 $\mu$m Semiconductor Laser Preamplifiers", *Electronics Letters*, Vol. 24, No. 9, Apr. 28, 1988, pp. 569–570, discloses the dereflecting of end faces of a resonator of a semiconductor amplifier by utilizing dielectric layers or coatings. Narrow tolerances must be observed in the manufacture of these coatings or layers in order to achieve the required, low residual reflection. Slight residual reflection is only achieved in a narrow wavelength band.

An article by Barnsley et al entitled "Ultra-low Reflectivity Broadband 1.5 $\mu$m GaInAsP Semiconductor Optical Amplifiers", *Electronics Letters*, Vol. 26, No. 12, Jun. 7, 1990, pp. 825–827, discloses an optical semiconductor amplifier whose waveguides extend obliquely relative to the normal of the cleavage plane of the semiconductor. A large deflection angle of approximately 20°–40° of the light emission relative to the normal, vis-a-vis the cleavage face of the semiconductor must be accepted in order to achieve low residual reflection. Large deflection angles are a disadvantage when coupling an optical fiber to this chip.

An article by Cha et al entitled "1.5 $\mu$m Band Travelling-Wave Semiconductor Optical Amplifier with Window Facet Structure", *Electronics Letters*, Vol. 25, No. 3, Feb. 2, 1989, pp. 242–243 and an article by Dutta et al entitled "Fabrication and Performance Characteristic of Buried Facet Optical Amplifiers", *J. Appl. Phys.*, Vol. 67, No. 9, May 1, 1990, pp. 3943–3947, disclose optical amplifiers having a buried waveguide end face. Dependent on the waveguide structure, a spacing of 5 $\mu$m through 20 $\mu$m is selected between the buried end face and the cleavage face for dereflecting the cleavage face. The effectiveness of the anti-reflection method is limited by the reflection at the end face of the waveguide in the inside of the semiconductor material.

SUMMARY OF THE INVENTION

It is an object of the present invention to specify or provide a component which has an integrated waveguide, wherein the end faces of this waveguide are dereflected with optimum efficiency in an optimally simple way.

This object is achieved with a component which, on a substrate, has an integrated waveguide with a longitudinal direction, said waveguide having a center axis extending in the longitudinal direction and having a buried end face, said waveguide having a cross sectional area in a plane extending perpendicular to the longitudinal direction, which area decreases as the plane of the cross section extends toward the end of the waveguide and a spacing between a geometric center of the cross sectional area of the waveguide and a center axis of the waveguide increases as the distance of the plane from the end face decreases. In other words, the cross sectional area of the waveguide varies adjacent the end, with the amount of area decreasing, which is caused by the end face not lying in a plane extending perpendicular to the center axis of the waveguide. The term "geometric center" is a center which is determined by conventional mathematical formulas to determine the center of the area enclosed in the cross section, similar to determining the center of gravity of a member which lies substantially in a single plane.

The dereflecting, or reduction in the reflectivity, of the end face of the waveguide inventively occurs in that the waveguide is fashioned with buried end faces and these end faces extend obliquely relative to the longitudinal direction of the waveguide. For example, the surface normal to these end faces is not parallel to the longitudinal axis of the waveguide. This invention can particularly be employed in semiconductor components wherein the waveguide is a semiconductor material whose refractive index differs from the surrounding material.

Other advantages and features of the invention will be readily apparent from the following description of the preferred embodiments, the drawings and claims.

BRIEF DESCRIPTION OF THE DRAWINGS

FIG. 1 is a schematic cross sectional view along the lines I—I of FIG. 2 of a component in accordance with the present invention;

FIG. 2 is a cross sectional view taken along the lines II—II of FIG. 1 of the component of FIG. 1;

DESCRIPTION OF THE PREFERRED EMBODIMENTS

Figure 3:
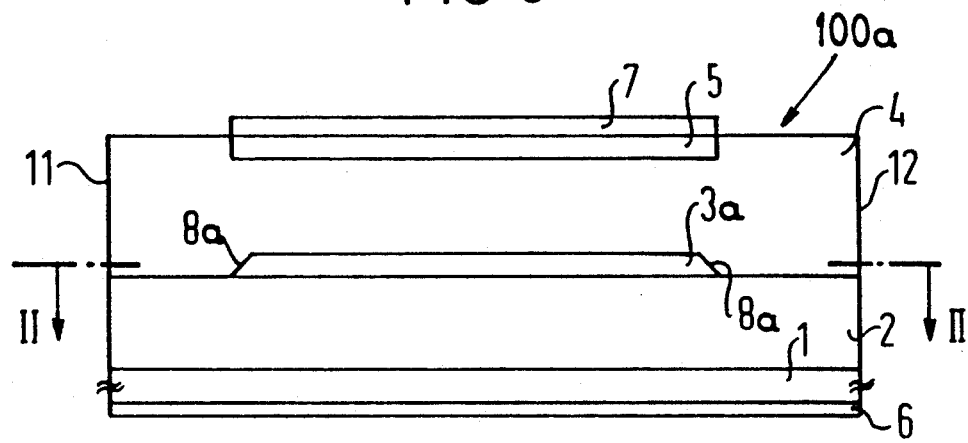
FIG. 3 is a cross sectional view similar to FIG. 1 of a modification of the semiconductor and component of FIG. 1.

The principles of the present invention are particularly useful when incorporated in a component, generally indicated at 100 in FIG. 1. The component in FIGS. 1 and 2 includes a lower jacket or cladding layer 2, which is grown onto a substrate 1. A strip-shaped layer as a waveguide 3 is situated on the lower jacket layer 2 and this waveguide is then covered from above with an upper jacket layer or cladding layer 4. The upper jacket layer 4 also limits the waveguide laterally and in the longitudinal direction. Therefore, the waveguide 3 will have end faces 8 which are buried end faces. These end faces 8 are illustrated in FIG. 1 as extending in a vertical plane; however, they can also be inclined as the end faces 8a of the waveguide 3a of FIG. 3.

The jacket layers 2 and 4 are made of a semiconductor material which has a lower refractive index than the semiconductor material forming the waveguide 3. A beam guidance will, thus, occur in the waveguide 3. When current is applied, the waveguide 3 can be operated as an active layer for generating radiation. As illustrated in FIG. 1, a highly doped contact layer 5 is provided on an upper surface of the layer 4 and an electrode, such as metal contacts 6, is provided on the substrate 1 and a metal layer 7 is applied on the highly doped layer 5. Given a structure in the material system of InP/InGaAsP, the substrate 1 and the lower jacket layer 2 are composed, for example of n-doped InP. The waveguide has an active layer composed of 1.56 μm InGaAsP. The upper jacket layer 4 is composed of a p-doped InP material and the contact layer 5 is composed, for example, of a highly p-doped InGaAsP material. The structure in the material system of a GaAs or other semiconductor material is also possible.

What is hereby critical is that the waveguide 3 is buried, for example the end faces 8 of the waveguide are respectively adjacent a further semiconductor material, which is formed, as illustrated, by the upper jacket layer 4. The end face 8 of the waveguide 3 is, therefore, arranged at a distance to the outer boundary end surfaces 11 and 12 that form the boundary between the semiconductor material and the surrounding air. The end faces 8 also, as illustrated in FIG. 2, extend in oblique planes relative to a longitudinal direction or center axis 15 of the waveguide 3, which direction is a propagation direction for the radiation. Surface normals 21 of each of the end faces 8, as illustrated in FIG. 2, are, therefore, not parallel to this longitudinal direction 15 and form angles therewith.

In the illustrated exemplary embodiment, the waveguide 3 is 0.4 μm thick and 1.6 μm wide. The application of the present invention is especially advantageous given the thickness of at least 0.1 μm for the waveguide 3. The end face 8 of the waveguide 3 can comprise lateral round portions 17, as shown in FIG. 2. The component, as a whole, can be shaped such that the outer boundary end surfaces 11 and 12 of the semiconductor material have surface normals 9 and 10 in the ambient air that proceeds substantially parallel to the longitudinal direction or axis 15 of the waveguide 3.

In FIG. 2, both the end faces 8 of the waveguide 3 proceed obliquely so that the beam path of the incident light ray 16 exhibits two bend locations because of the two, existing boundary surfaces between materials having different refractive indices. Instead of having boundary end surfaces, such as 11 and 12, which extend perpendicular to the axis 15, the outer boundary end surfaces, such as 13 and 14, can have normals, such as 19 and 20, respectively, that form an angle different from zero with the longitudinal direction or axis 15. This surface normal, on the outer boundary end surface 13, however, proceeds in a plane defined by the surface normal onto the end face of the waveguide 3 and by the longitudinal direction 15. The surface normal 19, at the outer boundary end surface 13, is turned from the longitudinal direction 15 in a rotational sense opposite to that of the surface normal 21 at the adjacent end face of the waveguide 3, as shown in FIG. 2. What is, thus, achieved is that the beam path 16 of the incident light outside the component proceeds substantially parallel to the surface normal 19. When the outer boundary end surface 13 is arranged even more obliquely, the beam path 16 outside of the semiconductor component is, again, parallel to the longitudinal direction 15 and, because of the double transition between materials having different refractive indices, is bent twice and is, thus, shifted parallel as a whole.

Correspondingly, the outer boundary end surface 14, on the side of the emerging light, can also be obliquely arranged so that the surface normal 20 on this outer boundary end surface 14 proceeds parallel to the beam path 18 of the emerging light. Given an even more oblique arrangement, what is also achieved here is that the beam path is bent to such an extent at the transition boundary surface between the semiconductor material and air that it subsequently proceeds parallel to the longitudinal direction 15. An easier coupling to an external optical fiber or passage of the light through the component that is linear overall is, thus, guaranteed.

The outer boundary end surfaces 11 and 12 or, respectively, 13 and 14, can also be dereflected with a dielectric layer in a traditional way. The inventive structure of the integrated waveguide can also be employed given a format having a ridge waveguide. An abrupt transition of a section having a narrow beam limitation in a section without lateral limitations can also be interpreted as an end face of the waveguide. In this case, the waveguide has its end faces adjacent to the same material that constitutes the waveguide itself, but is laterally limited by different materials. The waveguide need not be composed of a semiconductor material, but can be of any material standard for waveguides that is embedded in correspondingly standard materials, which is also not necessarily a semiconductor material. For example, a composition of $Si_3N_4$ and $SiO_x$ comes into consideration for the waveguide. The surrounding material is then, for example, $SiO_2$.

As mentioned above, the buried end faces 8 can be inventively turned around a vertical axis, as illustrated in FIG. 2, or around a horizontal axis, as illustrated by the end faces 8a of FIG. 3. In addition, they can be turned around both axes so that the surface normals 21 do not proceed as usually parallel to the longitudinal axis. In the case of rotation around both axes, it must be taken into consideration, because of the standard dimensions of the cross sectional area of the waveguide 3, that the rotation around the verticals axis, as illustrated in FIG. 2, is of a greater significance, i.e., that a smaller angle between the surface normal 21 and the longitudinal direction 15 than in the case of the rotation around a horizontal axis, as illustrated in FIG. 3.

Instead of being substantially flat planers, end faces can also be curved so that the surface normals 21 are not parallel to one another. The end faces 8 also, in accordance with an above exemplary embodiment, can be turned out of position symmetrically, vis-a-vis the center axis of the waveguide 3.

In the case of rotation around the horizontal axis, as illustrated in FIG. 3, which illustrates a component, generally indicated at 100a, an angle of approximately 45° between the surface normal —that is a representative surface normal in case of a slightly curved end face 8a—and the longitudinal direction 15, is advantageous.

Figure 4:
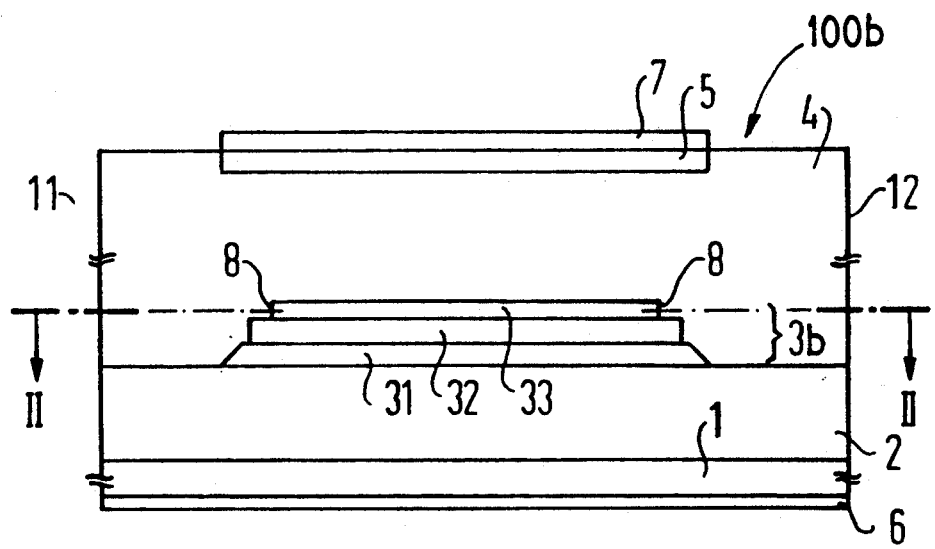
FIG. 4 is a cross sectional view similar to the view of FIG. 1 of another embodiment of the component.

A modification or embodiment of the component of FIG. 1 is generally indicated at 100b in FIG. 4 and is formed by a multi-structured waveguide 3b. The waveguide 3b, for example, comprises three layer 31, 32 and 33 whereof at least one layer, such as 31 has inventively bevelled end faces. A possible layer sequence for an appropriate embodiment comprises a lower waveguide 31, for example of an n-doped InGaAsP of a wavelength of approximately 1.3 μm. An intermediate layer 32, for example of n-doped-InP, and upper layer 33 as an active layer, for example of an undoped InGaAsP having a wavelength of approximately 1.5 μm. The intermediate layer 32 can also be lacking or inversely doped and can serve as a common power lead for the lower waveguide layer 31 and for the upper waveguide 33. However, it is also possible for the middle layer 32 to function as an active layer that is, then, for example, an InGaAsP material having a wavelength of approximately 1.5 μm and that it is vertically limited by the lower waveguide layer 31 and by the upper waveguide layer 33, each respectively of an InGaAsP material having a wavelength of approximately 1.3 μm.

A particularly advantage of the arrangement of the invention can be seen wherein the reflectivity of the buried end faces of the waveguide can be significantly reduced without the direction of the radiation being significantly deflected when coupled from the waveguide. On the one hand, the emission from the outer boundary end surface can occur at such a predetermined deflection angle as a result of oblique, buried end faces that the reflection at this outer boundary end surface back into the waveguide is reduced. The minimum spacing between the buried end face and the outer boundary end surface required for the dereflection of the outer boundary end surface can be reduced by the oblique arrangement of the end face of the waveguide. Due to the combination of the oblique end faces of the waveguide and the oblique outer boundary end surfaces, the reflection can be minimized and the beam path can be further optimized.

As illustrated in FIG. 2, if a cross sectional plane which extends perpendicular to the axis 15 moves from the position illustrated by line 50 to a position of line 51 and then, finally, to a position of line 52, which is moving toward the end of the waveguide 3, the area of the plane decreases and the geometric center of this plane shifts from a position 60, which is substantially on the center line 15 progressively to positions of points 61, 62, which have increased spacing from the center line or axis 15. In a similar manner, it can be seen in FIG. 3 that if the end face 8a is oblique, or slanting to the axis 15, as the plane is moved toward the end of the waveguide 3a, the area inscribed by the waveguide will decrease and the center of this area will be shifted away from the center line of the waveguide 3a.

Although various minor modifications may be suggested by those versed in the art, it should be understood that I wish to embody within the scope of the patent granted hereon all such modifications as reasonably and properly come within the scope of my contribution to the art.

I claim:

1. A component comprising a substrate having an integrated waveguide of a solid material with a longitudinal direction, said waveguide having a center axis and being surrounded by another material of a refractive index lower than the refractive index of the solid material of the waveguide to form buried end faces for the waveguide and outer boundary end surfaces for the component, each of said end faces of the waveguide having a surface normal with a projection of each surface normal and center axis forming an angle greater than zero on a plane surface of the substrate facing the waveguide, said waveguide adjacent each end having a cross sectional area residing in a plane extending perpendicular to the center axis that decreases as the distance of the plane from the end decreases and a geometric center of the area in each plane has an increasing offset from the center axis as the distance of the plane from the end decreases.

2. A component according to claim 1, wherein the outer boundary end surfaces have a surface normal extending parallel to the center axis.

3. A component according to claim 1, wherein the outer boundary end surfaces have a surface normal forming an angle with the center axis.

4. A component comprising a substrate having an integrated waveguide of solid material with a longitudinal direction, said waveguide having a center axis extending in said longitudinal direction and having an end with a buried end face, said end face having a surface normal, a projection of the surface normal of the end face and the longitudinal direction onto a plane surface of the substrate facing toward the waveguide forms an angle differing from zero, said waveguide adjacent the buried end face having a cross sectional area residing in a plane extending perpendicular to the longitudinal direction that uniformly decreases as the distance of the plane from the end of the waveguide decreases, and a geometric center of the cross sectional area of the waveguide in each of the perpendicular planes having an increasing spacing from the center axis of the waveguide as the distance of the plane from the end decreases.

5. A component according to claim 4, wherein the end face adjoins solid material with a lower refractive index than the material of the waveguide.

6. A component comprising a substrate having an integrated waveguide of solid material with a longitudinal direction, said waveguide having a center axis extending in said longitudinal direction and having an end with a buried end face, said end face having a surface normal, a projection of the surface normal and the longitudinal direction onto a plane surface of the substrate facing the waveguide forming an angle greater than zero, said waveguide adjacent the end having a cross sectional area residing in a plane extending perpendicular to the longitudinal direction that decreases as the distance of the plane from the end of the waveguide decreases, a geometric center of the cross sectional area of the waveguide in each of the perpendicular planes has an increasing spacing from the center axis of the waveguide as the distance of the plane from the end decreases, and the buried end face adjoins solid material that has a different refractive index than the refractive index of the solid material of the waveguide.

7. A component according to claim 6, wherein the area of the cross sectional waveguide lying in the perpendicular planes decreases in at least one step in a section of the waveguide, which is situated adjacent the end face.

8. A component according to claim 6, wherein the material adjoining the buried end face outside of the waveguide in a longitudinal direction of the waveguide has an outer boundary surface, whose surface normal extends parallel to the longitudinal direction.

9. A component according to claim 6, wherein the material adjoining the buried end face outside of the waveguide in a longitudinal direction of the waveguide has an outer boundary surface, whose surface normal does not extend parallel to the longitudinal direction.

10. A component according to claim 6, wherein the material adjoining the buried end face has a lower refractive index than the material of the waveguide.

11. A component according to claim 10, wherein the material adjoining the buried end face outside of the waveguide in a longitudinal direction of the waveguide has an outer boundary surface, whose surface normal extends parallel to the longitudinal direction.

12. A component according to claim 10, wherein the material adjoining the buried end face outside of the waveguide in a longitudinal direction of the waveguide has an outer boundary surface, whose surface normal does not extend parallel to the longitudinal direction.

13. A component according to claim 6, wherein the waveguide is limited in the longitudinal direction by buried end faces at the two opposite ends, wherein the area of the cross sectional area of the waveguide residing in the planes extending perpendicular to the longitudinal direction decreases towards every end face and wherein the spacing between the geometric center of each of the cross sectional area of the waveguide and a center axis of the waveguide increases as the plane approaches each of the ends of the waveguides.

14. A component according to claim 6, wherein the waveguide is a semiconductor material.

15. A component according to claim 14, wherein the waveguide is formed by an active layer disposed between cladding layers of semiconductor material.

16. A component according to claim 6, wherein the waveguide is of a solid material other than a semiconductor material.

* * * * *